(12) United States Patent
Baba

(10) Patent No.: US 7,712,002 B2
(45) Date of Patent: May 4, 2010

(54) TEST CIRCUIT FOR SEMICONDUCTOR INTEGRATED CIRCUIT

(75) Inventor: Toshiaki Baba, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 405 days.

(21) Appl. No.: 11/592,163

(22) Filed: Nov. 3, 2006

(65) Prior Publication Data

US 2007/0143652 A1 Jun. 21, 2007

(30) Foreign Application Priority Data

Dec. 21, 2005 (JP) ............................. 2005-368387

(51) Int. Cl.
*G01R 31/28* (2006.01)
(52) U.S. Cl. ....................... 714/726; 714/727; 714/729; 714/731
(58) Field of Classification Search ........................ None
See application file for complete search history.

(56) References Cited

U.S. PATENT DOCUMENTS

| | | | | |
|---|---|---|---|---|
| 4,513,418 A | * | 4/1985 | Bardell et al. ................ | 714/726 |
| 5,130,647 A | * | 7/1992 | Sakashita et al. ............ | 714/731 |
| 5,592,493 A | * | 1/1997 | Crouch et al. ................ | 714/729 |
| 5,878,055 A | * | 3/1999 | Allen .......................... | 714/744 |
| 6,023,778 A | * | 2/2000 | Li ................................ | 714/726 |
| 6,728,914 B2 | * | 4/2004 | McCauley et al. ........... | 714/726 |
| 7,441,169 B2 | * | 10/2008 | Maeno ........................ | 714/726 |
| 2003/0145263 A1 | * | 7/2003 | Song et al. ................... | 714/726 |
| 2005/0229056 A1 | * | 10/2005 | Rohrbaugh et al. ......... | 714/726 |
| 2006/0168489 A1 | * | 7/2006 | Mitra et al. ................... | 714/724 |

FOREIGN PATENT DOCUMENTS

JP 10-267994 10/1998

* cited by examiner

*Primary Examiner*—Kevin L Ellis
*Assistant Examiner*—Guerrier Merant
(74) *Attorney, Agent, or Firm*—Studebaker & Brackett PC; Donald R. Studebaker

(57) ABSTRACT

The present invention provides a test circuit for a semiconductor integrated circuit that can be used for testing plural of logic blocks each having plural input-output terminals. This test circuit is provided with scanning flip-flop (SFF) circuits whose output terminals are connected to the input terminals of the logic blocks. The SFF circuits hold test data which is sequentially supplied, supply the test data to the logic blocks and receive logic operation data generated from the logic blocks. The logic operation data may be sequentially supplied from the SFF circuits, on the basis of which performances of the logic blocks are examined.

5 Claims, 7 Drawing Sheets

TEST CIRCUIT FOR SEMICONDUCTOR INTEGRATED CIRCUIT

BACKGROUND OF THE INVENTION

1. Field of the Invention

The present invention relates to a test circuit, and in particular, relates to a test circuit for a semiconductor integrated circuit.

2. Description of the Related Art

FIG. 1 is a circuit diagram showing a conventional test circuit for a semiconductor integrated circuit disclosed by Japanese Kokai Tokkyo Kohou H10-267994 (D1) which corresponds to U.S. Pat. No. 6,073,260. This test circuit is to test logic blocks 1, 3, 5 and comprises scanning flip-flop (SFF) circuits 10-1 and 10-2 and a selector 6. A scanning input data SIN, which is a data for testing the logic blocks 10-1 and 10-2, is supplied from a scanning data input terminal 10. A clock signal CLK is supplied from a clock signal input terminal 11 to clock terminals of the SFF circuits 10-1 and 10-2. A mode designation signal MOD is supplied from a mode designation signal input terminal 12 to mode selection terminals SE of the SFF circuits 10-1 and 10-2. Scanning output data, which are logic signals generated from the logic blocks 1, 3, and 5, are output from a scanning output terminal 13. This test circuit sequentially inputs the scanning input data SIN which are data for testing the logic blocks 10-1 and 10-2 from the scanning data input terminal 10 and sequentially outputs scanning output data SOUT which are resultant logic signals generated from logic blocks 1, 3, and 5 in response to the scanning input data SIN. It is possible to examine operations of the logic blocks 1, 3, and 5, for example, by comparing the scanning output data SOUT with expected data.

As shown in FIG. 1, the scanning input terminal 10 is connected to a scanning input terminal SI of the SFF circuit 10-1 through a scanning path 1S and an input terminal IN of the logic block 1. An output terminal OUT of the logic block 1 is connected to an input terminal D of the SFF circuit 10-1. An output terminal of the SFF circuit 10-1 is connected to a scanning input terminal SI of the SFF circuit 10-2 through a scanning path 3S and to an input terminal IN of the logic block 3. An output terminal OUT of the logic block 3 is connected to an input terminal D of the SFF circuit 10-2. An output terminal Q of the SFF circuit 10-2 is connected to the selector (SEL) 6 through a scanning path 5S and an input terminal IN of the logic block 5. An output terminal OUT of the logic block 5 is connected to the SEL 6. An output terminal of the SEL 6 corresponds to the scanning output terminal 13. The clock signal input terminal 11 is connected to clock terminals of the SFF circuits 10-1 and 10-2. The mode designation signal input terminal 12 is connected to mode selection terminals SE of the SFF circuits 10-1 and 10-2 and the selector SEL circuit 6.

The D1 further discloses the SFF circuit which is provided with a first FF circuit, a selector circuit, and a second FF circuit. The first FF holds a data at a timing of an inversed clock signal. The selector circuit inputs a data from either the logic block or the first FF circuit and outputs the data. The second FF holds the data supplied from the selector circuit at a timing of the clock signal CLK.

However, there are some problems in the conventional test circuit for a semiconductor integrated circuit of FIG. 1. One of the problems is that the conventional test circuit is only applicable to a simple logic block having only one input-output terminal for testing. As stated above, the typical logic block mounted on the semiconductor integrated circuit is provided with plural input-output terminals, and thus performs plural logic operations. There is a possibility that the conventional test circuit is inadequate for testing such a complex logic block that has plural input-output terminals and performs plural logic operations at the same time. Therefore, there is a problem of reliability of the conventional test circuit.

SUMMARY OF THE INVENTION

An object of the present invention is to provide a test circuit for a semiconductor integrated circuit that can test plural logic blocks while using their plural input and output terminals as input and output test terminals.

According to an aspect of the present invention, there is provided a test circuit for testing a basic logic block having at least two input terminals and at least two output terminals which operates in synchronism with a clock signal and at least one additional logic block having at least two input terminals and at least two output terminals which operates in synchronism with the clock signal. The test circuit is provided with two basic bit holding and relaying units whose output terminals are connected to input terminals of the basic logic block, respectively and two additional bit holding and relaying units whose output terminals are connected to input terminals of the additional logic block, respectively. Both of the basic and additional bit holding and relaying units operate in synchronism with the clock signal. Each of the basic and additional bit holding and relaying units has a data input terminal, a scanning input terminal, and a mode switching terminal, receives a data bit by bit selected from datas supplied to the data input terminal and the scanning input terminal in accordance with a mode designation signal supplied to the mode switching terminal thereby to hold the data and then relays the data to the output terminal. One of the basic bit holding and relaying units receives at the scanning input terminal thereof an output data generated from the other of the basic bit holding and relaying units while an output data from the one of the basic bit holding and relaying units is supplied to the scanning input terminal of one of the additional bit holding and relaying units. An output data from the one of the additional bit holding and relaying units is supplied to the scanning input terminal of the other of the additional bit holding and relaying units. An external input data is supplied to the scanning input terminal of the other of the basic bit holding and relaying units. An output terminal of the other of the additional bit holding and relaying units is a test data output terminal.

According to the aspect of the present invention, the basic and additional bit holding and relaying units, which are respectively provided at front stages of the basic and additional logic blocks having plural of input-output terminals, hold test data, supply the test data to the basic and additional logic blocks at the same time, hold logic signals generated from the basic and additional logic blocks, and sequentially output the logic signals, on the basis of which the basic and additional logic blocks are examined. The test circuit according to the present can test plural logic blocks having plural input and output terminals resulting in improvement of reliability of the examination.

BRIEF DESCRIPTION OF THE INVENTION

DETAILED DESCRIPTION OF THE INVENTION

The following is a detailed explanation of several preferred embodiments of test circuits for semiconductor integrated circuits in reference to drawings. It should be however noted that the present invention is not limited to the following descriptions and embodiments described by the drawings.

FIRST EMBODIMENT

Figure 1:
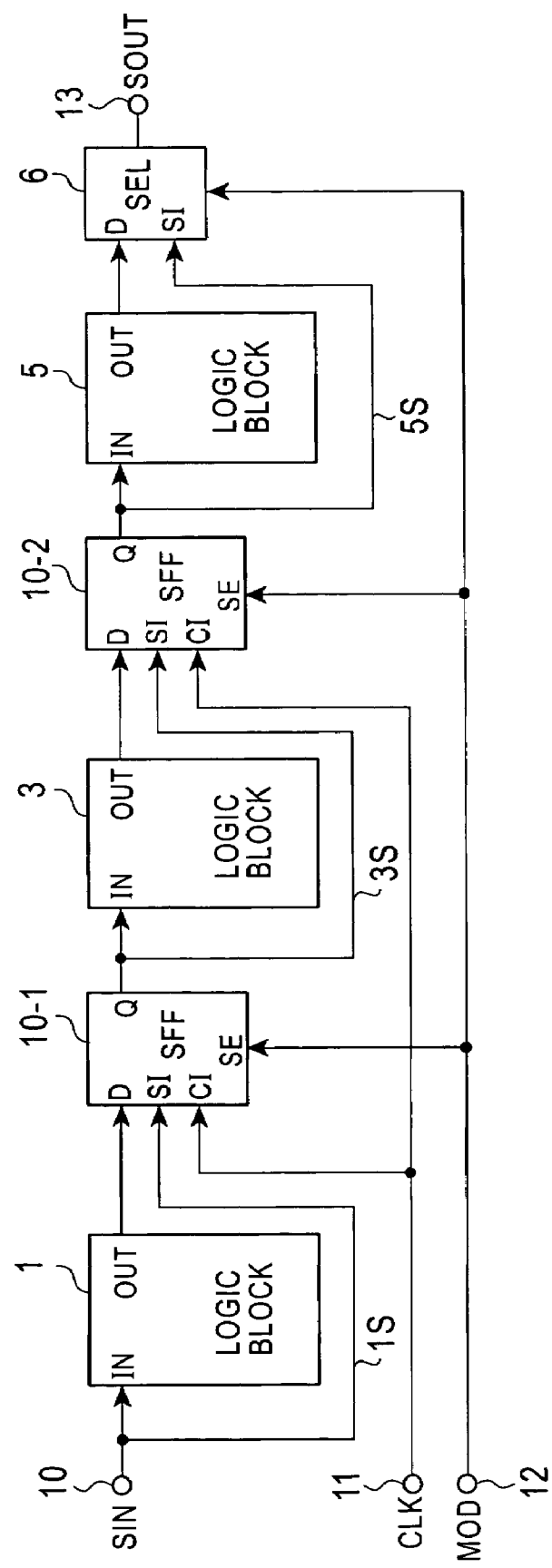
FIG. 1 is a schematic block diagram showing a conventional test circuit.
Figure 2:
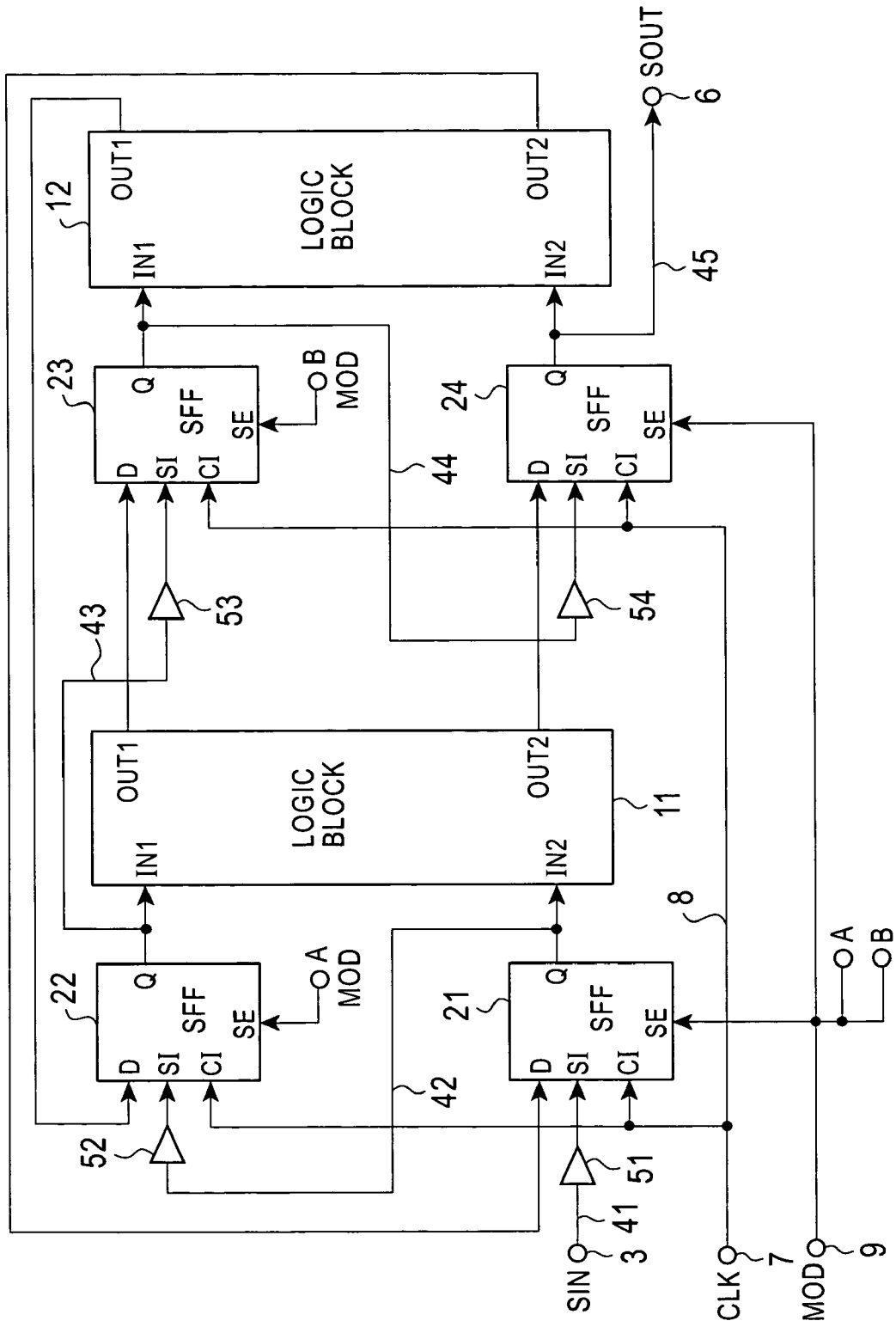
FIG. 2 is a schematic block diagram showing a test circuit that is a first embodiment of the present invention.

FIG. 2 is a circuit diagram showing a test circuit for a semiconductor integrated circuit which is a first embodiment of the present invention. The test circuit is to test a basic logic block (e.g., a logic block 11) having at least two input terminals (e.g., IN1 and IN2) and at least two output terminals (e.g., OUT1 and OUT2) which operates in synchronism with a clock signal and at least one additional logic block (e.g., a logic block 12) having at least two input terminals (e.g., IN1 and IN2) and at least two output terminals (e.g., OUT1 and OUT2) which operates in synchronism with said clock signal. The test circuit is provided with two basic bit holding and relaying units (e.g., SFF circuits 21 and 22) whose output terminals are connected to input terminals of said basic logic block, respectively, and two additional bit holding and relaying units (e.g., SFF circuits 23 and 24) whose output terminals are connected to input terminals of said additional logic block, respectively. In addition, the test circuit is provided with delay signal circuits (e.g., inverter circuits 51, 52) at front stages of the two basic bit holding and relaying units and input delay circuits (e.g., inverter circuits 53, 54) at front stages of the two additional bit holding and relaying units.

A scanning input signal SIN, a clock signal CLK, a mode designation signal MOD are supplied from a scanning input terminal 3, a clock terminal 7, and a mode selection terminal 9, respectively. The clock signal CLK is supplied to clock terminals of the SFF circuits 21 to 24. The mode designation signal MOD is supplied to mode selection terminals of the SFF circuits 21 to 24. A scanning output data SOUT is output from a scanning output terminal 6. The test circuit inputs the scanning input data SIN and outputs the scanning output data SOUT which are logic signals generated from the logic blocks 11, 12. Performances of the logic blocks 11 and 12 are examined based on the scanning output data SOUT.

Each of the SFF circuits 21 to 24 is provided with a scanning input terminal SI, an input terminal D, a mode selection terminal SE from which a mode designation signal MOD is received, a clock terminal CI from which a clock signal CLK is received, and an output terminal Q. Each of the SFF circuits 21 to 24 is provided with a D-flip flop (D-FF) circuit and a two-input switching relaying switch connected to an input terminal of the D-FF circuit which performs a switching operation in accordance with the mode designation signal MOD (not shown in FIG. 2). These SFF circuits 21 to 24 operate in either one of two modes; a scanning mode and a normal operation mode in accordance with the mode designation signal MOD. In the normal operation mode, the input terminal D of each the SFF circuits 21 to 24 is designated for receiving a data in synchronization with the clock signal CLK supplied to the clock terminal CI. In the scanning mode, the scanning input terminal SI of each the SFF circuits 21 to 24 is designated for receiving a data in synchronization with the clock signal CLK supplied to the clock terminal CI.

The scanning input terminal 3 is connected to the scanning input terminal SI of the SFF circuit 21 via the inverter circuit 51 by a scanning path 41. The inverter circuit 51 is used for adjusting a delay time of the scanning input data SIN supplied to the SFF circuit 21. By a scanning path 42, the output terminal Q of the SFF circuit 21 is connected to an input terminal I2 of the logic block 11 and the scanning input terminal SI of the SFF circuit 22 via the inverter circuit 52. By a scanning path 43, the output terminal Q of the SFF circuit 22 is connected to an input terminal I1 of the logic block 11 and the scanning input terminal SI of the SFF circuit 23 via the inverter circuit 53. By a scanning path 44, the output terminal Q of the SFF circuit 23 is connected to an input terminal I1 of the logic block 12 and the scanning input terminal SI of the SFF circuit 24 via the inverter circuit 54.

Phase differences among clock signals CLK supplied from the clock terminal 7 to each of the clock terminals CI of the SFF circuits 21 to 24 via a clock-supplying path 8 are negligible, so that the four SFF circuits 21 to 24 substantially operate at the same time in response to the clock signal CLK. The mode designation signal MOD is supplied from a mode selecting terminal 9 to each mode selection terminals SE of the SFF circuits 21 to 24. It is to be noted that the logic blocks 11 and 12 receive other signals supplied from other circuits and external input terminals and output resultant signals of logic operation to other circuits and external output terminals (not shown in FIG. 2).

Each of the inverter circuits 51 to 54 including even-numbered inverters which are cascade-connected in series receives a data and outputs the data which is delayed by a required time interval with respect to the input data.

Operations of the first embodiment will be explained. Operation properties of the logic blocks 11 and 12 are examined by comparing the logic signals generated from the logic blocks 11 and 12 with expected data. Test operation are performed through the following processes A to D.

A. The Scanning Mode is Designated.

A mode designation signal is given to the SFF circuits 21 to 24, so that each of the SFF circuits 21 to 24 receives scanning input signal SIN from the scanning input terminal SI thereof. A scanning chain path from the scanning input terminal 3 to the scanning output terminal 6 is formed passing through the scanning path 41, the inverter circuit 51, the SFF circuit 21, scanning path 42, the inverter circuit 52, the SFF circuit 22, the scanning path 43, the inverter circuit 53, the SFF circuit 23, the scanning path 44, the inverter circuit 53, and the SFF circuit 24.

B. Scanning Input Data SIN are Supplied.

The scanning mode, where the scanning chain path is formed, is kept and scanning input data SIN is supplied from the scanning input terminal 3 to the SFF circuits 21-24 in sequence. The SFF circuits 21 to 24 forming a shift register passing through the scanning chain path hold the scanning input data SIN. For instance, scanning input data SIN1, SIN2, SIN3, and SIN4 are sequentially supplied to scanning input terminal 3 in synchronization with the clock signal, and then the scanning input data SIN 1, SIN 2, SIN 3, and SIN 4 are held by SFF circuits 24, 23, 22, and 21, respectively. The scanning input data SIN 1 to 4 held by the SFF circuits 21 to 24 are supplied to input terminals IN1 and IN2 of logic blocks 11 and 12. The logic blocks 11 and 12 perform logic operations in response to the scanning input data SIN 1 to 4 and output resultant logic data LOG1, LOG2, LOG3, and LOG4 to the output terminals thereof OUT1 and OUT2. It should be noted that the SFF circuits 21 to 24 do not receive the resultant logic signals because the input terminals D of the SFF circuits 21 to 24 are not opened in the scanning mode.

C. The Normal Operation Mode is Designated.

In the next operation, the operation mode of the circuit is switched from the scanning mode to the normal operation mode by the mode designation signal MOD. In the normal operation mode, the scanning input terminal SI of each the SFF circuits 21 to 24 is closed, whereas the input terminal D of each the scanning SFF circuits 21 to 24 is opened. When one pulsed clock signal CLK is given to the SFF circuits 21 to 24. The SFF circuits 21 and 22 receive the resultant logic signals from the logic block 12 and hold the resultant logic signals. The scanning SFF circuits 23 and 24 receive the resultant logic signals from the logic block 11 and hold the resultant logic signals.

D. The Scanning Mode is Designated.

In the next operation, the operation mode of the circuit is switched back to the scanning mode by the mode designation signal MOD. A clock signal CLK is given to the scanning SFF circuits 21 to 24 from the clock terminal 7, the resultant logic signals held by the scanning SFF circuits 21 to 24 are sequentially output to the scanning output terminal 6.

By comparing scanning output data SOUT which are resultant logic signals (LOG1, LOG2, LOG3, LOG4) generated from the scanning output terminal 6 and expectation signals (E1, E2, E3, E4) calculated according to the scanning input data SIN, it is possible to examine performance of the logic blocks 11 and 12.

SECOND EMBODIMENT

Figure 3:
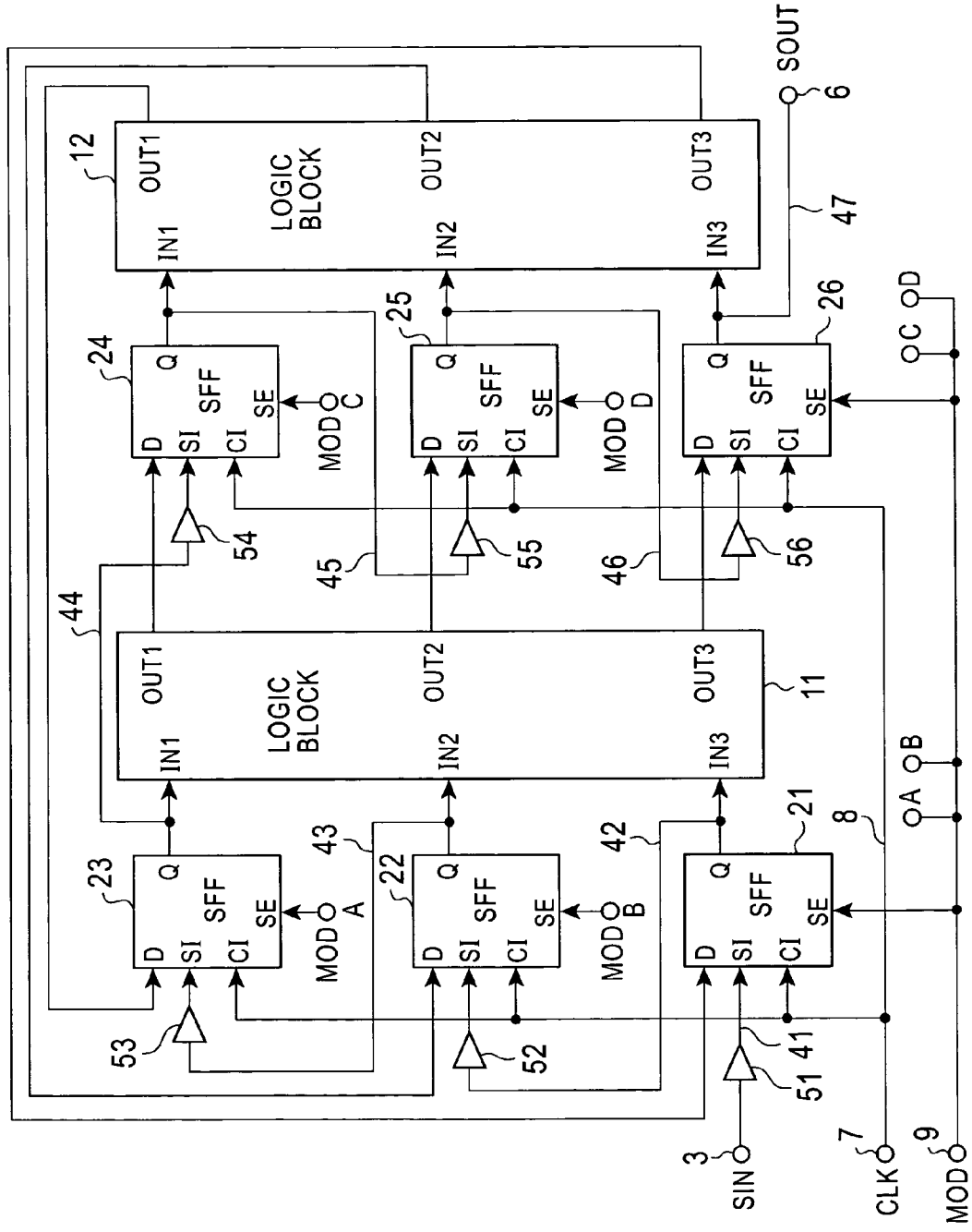
FIG. 3 is a schematic block diagram showing a test circuit that is a second embodiment of the present invention.

FIG. 3 is a block diagram illustrating a test circuit that is a second embodiment of the present invention. As shown in FIG. 3, The test circuit is to test a basic logic block (e.g., a logic block 11) having at least two input terminals (e.g., IN1 to IN3) and at least two output terminals (e.g., OUT1 to OUT3) which operates in synchronism with a clock signal and at least one additional logic block (e.g., a logic block 12) having at least two input terminals (e.g., IN1 to IN3) and at least two output terminals (e.g., OUT1 to OUT3) which operates in synchronism with said clock signal. The test circuit is provided with two basic bit holding and relaying units (e.g., SFF circuits 21 and 23) whose output terminals are connected to input terminals of said basic logic block, respectively, and two additional bit holding and relaying units (e.g., SFF circuits 24 and 26) whose output terminals are connected to input terminals of said additional logic block, respectively. In addition, the test circuit is provided with input delay circuits (e.g., inverter circuits 51 to 53) at front stages of the three basic bit holding and relaying units and input delay circuits (e.g., inverter circuits 54 to 56) at front stages of the three additional bit holding and relaying units. Other components are similar to that of the first embodiment shown in FIG. 2.

As shown in FIG. 3, each of the logic blocks 11 and 12 has three input-output terminals IN1 to IN3 and OUT1 to OUT3, and thus three SFF circuits 21 to 23 are provided at a front stage of the logic block 11 and three SFF circuits 24 to 26 are provided at a front stage of the logic block 12.

Since the logic blocks 11, 12, the SFF circuits 21 to 26, and the inverter circuits 51 to 56 perform operations similar to the first embodiment, detailed explanations of them are omitted.

Test operations of the test circuit of the second embodiment are performed through processes similar to the test operations A, B, C, and D described in the first embodiment. When scanning input data SIN1 to 6 are sequentially supplied to a scanning input terminal 3, the SFF circuits 21 to 26 sequentially relay the data SIN1 to 6, and then hold the data SIN1 to SIN6, respectively. The logic blocks 11 and 12 perform logic operations in response to the data SIN1 to SIN6 which are supplied from the SFF circuits 21 to 26 and then output the resultant logic signals LOG1 to LOG6 to the SFF circuits 21 to 26. The resultant logic signals LOG1 to LOG6 held by the SFF circuits 21 to 26 are sequentially supplied to the scanning output terminal 6. By comparing scanning output data SOUT which are resultant logic signals (LOG1, LOG2, LOG3, LOG4, LOG5, LOG6) generated from the scanning output terminal 6 and expectation signals (E1, E2, E3, E4, E5, E6) calculated according to the scanning input data SIN, it is possible to examine performance of the logic blocks 11 and 12.

THIRD EMBODIMENT

Figure 4:
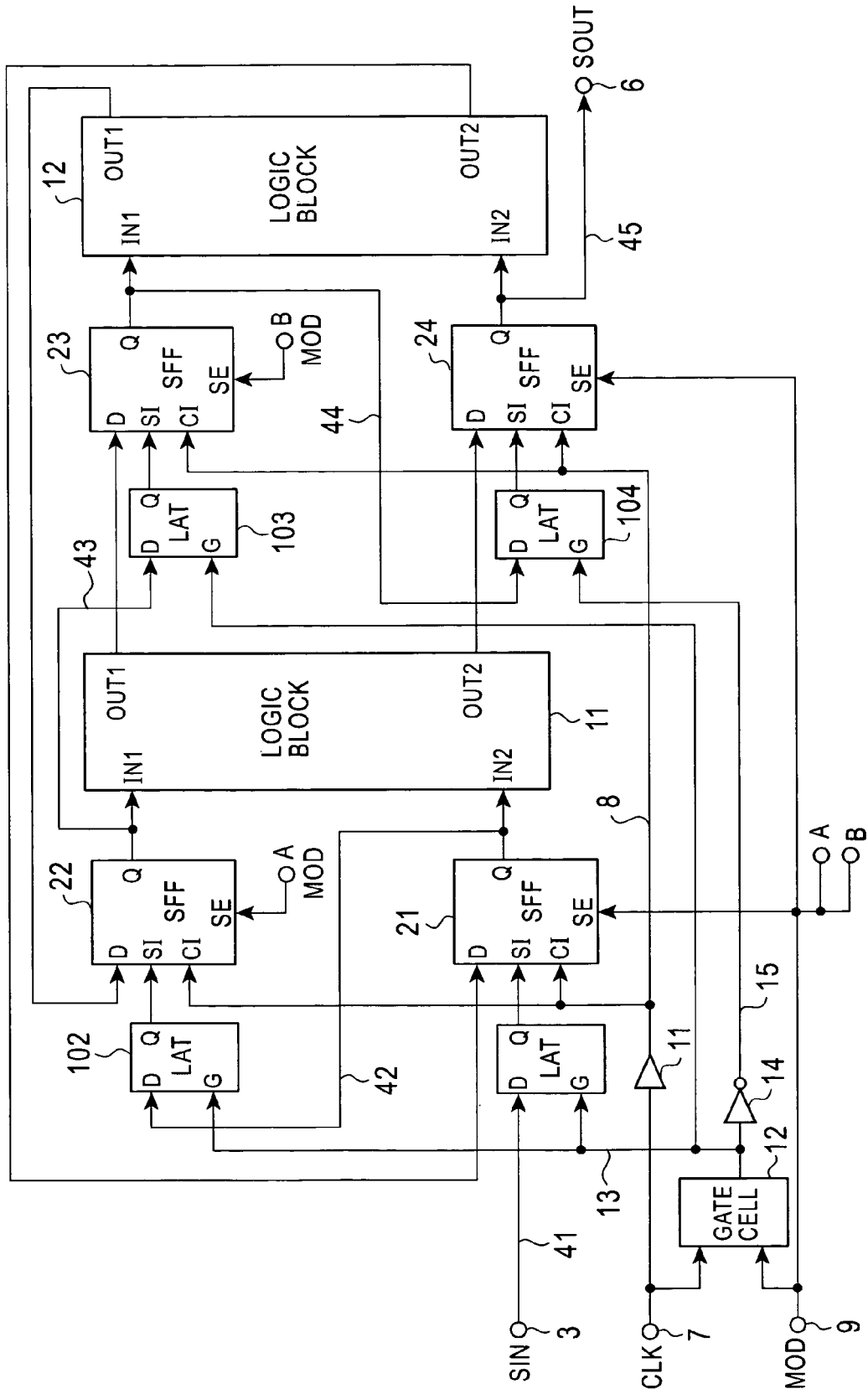
FIG. 4 is a schematic block diagram showing a test circuit that is a third embodiment of the present invention.

FIG. 4 is a test circuit for a semiconductor circuit that is a third embodiment of the present invention. The same reference numbers are assigned to components having practically identical structures and functions with that shown in FIGS. 2 and 3. As shown in FIG. 4, the test circuit is to test a basic logic block (e.g., a logic block 11) having at least two input terminals (e.g., IN1 and IN2) and at least two output terminals (e.g., OUT1 and OUT2) which operates in synchronism with a clock signal and at least one additional logic block (e.g., a logic block 12) having at least two input terminals (e.g., IN1 and IN2) and at least two output terminals (e.g., OUT1 and OUT2) which operates in synchronism with said clock signal. The test circuit is provided with two basic bit holding and relaying units (e.g., SFF circuits 21 and 22) whose output terminals are connected to input terminals of said basic logic block, respectively, and two additional bit holding and relaying units (e.g., SFF circuits 23 and 24) whose output terminals are connected to input terminals of said additional logic block, respectively. The basic bit holding and relaying units are provided with signal delay circuits (e.g., LAT circuits 101 and 102) at front stages thereof and The basic bit holding and the additional bit holding and relaying units are provided with signal delay circuits (e.g., LAT circuits 103 and 104) at front stages thereof.

In addition, the test circuit is provided with an inverter circuit 11, a gate cell 12, and inverter circuit 14. The inverter circuit 11 receives a clock signal CLK supplied from a clock signal input terminal 7 and output a delayed clock signal. The inverter circuit 11 is provided for adjusting a timing of a clock signal CLK given to each SFF circuits 21 to 24. The gate cell 12 is provided for supplying the clock signal CLK to the LAT circuits 101 to 104 only in a scanning mode.

In the third embodiment shown in FIG. 4, there are two kinds of the SFF circuits and the LAT circuits. One of the SFF circuits operates at a leading-edge of a clock signal and the other of the SFF circuits operates at a trailing-edge of the clock signal. The former SFF circuit is connected to one of the LAT circuits which operates at a trailing-edge of the clock signal, and the latter SFF circuit is connected to the other of the LAT circuits which operates at a leading-edge of the clock signal.

Each of the SFF circuits 21 to 24 operate responding to the clock signal CLK which is generated from the inverter circuit 11. Each of the SFF circuits 21 to 24 is provided with a scanning input terminal SI, an input terminal D, a mode selection terminal SE from which a mode designation signal MOD is supplied, a clock terminal CK from which a delayed clock signal CLK is supplied, and an output terminal Q. Each of the SFF circuits 21 to 24 operate in either one of two modes; a scanning mode and a normal operation mode. In the normal operation mode, each of the SFF circuits 21 to 24 receives a data from the input terminal D, holds the data, and outputs the data to the output terminal Q in synchronization with the delayed clock signal CLK from the clock terminal CI. In the scanning mode, each of the SFF circuits 21 to 24 receives a data from the scanning input terminal SI, holds the data, and outputs the data to the output terminal Q in synchronization with the delayed clock signal CLK from the clock terminal CI. In the third embodiment shown in FIG. 4, there are two kinds of the SFF circuits provided. Each of the SFF circuits 21 to 23 hold a data at a leading-edge of the clock signal CLK and output the data at a trailing-edge of the clock signal CLK. On the other hands, the SFF circuit 24 holds a data at a leading-edge of the clock signal CLK and outputs the data at a trailing-edge of the clock signal CLK.

The LAT circuits 101 to 104 operate in response to the clock signal CLK which is supplied from the clock signal input terminal 7 through the gate cell 12. There are two kinds of the LAT circuits. Each of the LAT circuits 101 to 103 latch a data supplied to input terminal D thereof at a trailing edge of the clock signal CLK and then outputs the data to output terminal Q thereof at a leading edge of the clock signal CLK. On the other hands, the LAT circuit 104 latch a data supplied to input terminal D thereof at a leading edge of the clock signal CLK and then outputs the data to output terminal Q thereof at a trailing edge of the clock signal CLK.

The scanning input terminal 3 is connected to a scanning input terminal SI of the SFF circuit 21 via the LAT 101 by a scanning path 41. By a scanning path 42, an output terminal Q of SFF circuit 21 is connected to an input terminal 12 of the logic block 11 and a scanning input terminal SI of the SFF circuit 22 via the LAT 102. By a scanning path 43, an output terminal Q of the SFF circuit 22 is connected to an input terminal I1 of the logic block 11 and the scanning input terminal SI of the SFF circuit 23 via the LAT 103. By a scanning path 44, an output terminal Q of SFF circuit 23 is connected to the input terminal I1 of the logic block 12 and the scanning input terminal SI of the SFF circuit 24 via the LAT 104. By a scanning path 45, an output terminal Q of the SFF circuit 24 is connected to the input terminal 12 of the logic block 12 and a scanning output terminal 6.

The clock signal CLK supplied from the clock terminal 7 is adjusted a timing thereof by the inverter circuit 11 and then supplied to each clock terminal CI of the SFF circuits 21 to 24 passing through a clock-supplying path 8. The mode designation signal MOD is supplied from the mode-selecting terminal 9 to each mode selection terminal SE of the SFF circuits 21 to 24.

The gate cell 12 receives the clock signal CLK and the mode designation signal MOD. The gate cell 12 outputs a data in a "L" level clock signal CLK at the time when the normal operation mode is selected by the mode designation signal MOD. On the other hands, the gate cell 12 outputs the clock signal CLK at the time when the scan mode is selected by the mode designation signal MOD. The gate cell 12 has a function similar to that of an AND gate. The gate cell is so composed that a beard pulse is not generated at a leading or trailing edges of an input signal.

The output terminal of the gate cell 12 is connected to each gate terminal G of the LAT circuits 101 to 103 by a clock-supplying path 13, and connected to a gate terminal G of the LAT 104 via inverter 14 by the clock-supplying path 15. It is to be noted that the logic blocks 11 and 12 may receive other signals from other circuits and external terminals and may output logic to other circuits and external output terminals (not shown in FIG. 4).

Figure 5:
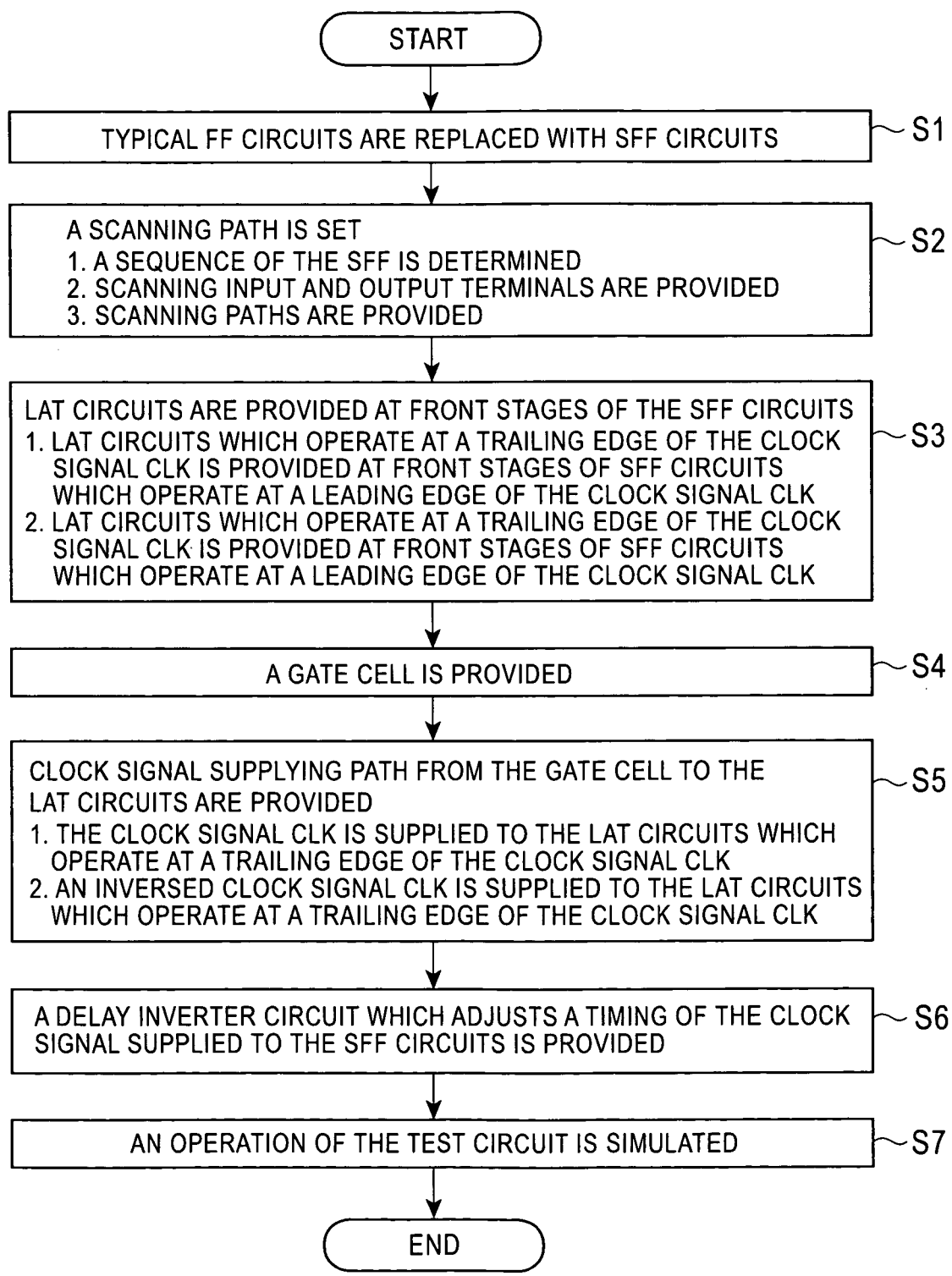
FIG. 5 is a flowchart representing a method for designing the test circuit of FIG. 4.
Figure 6:
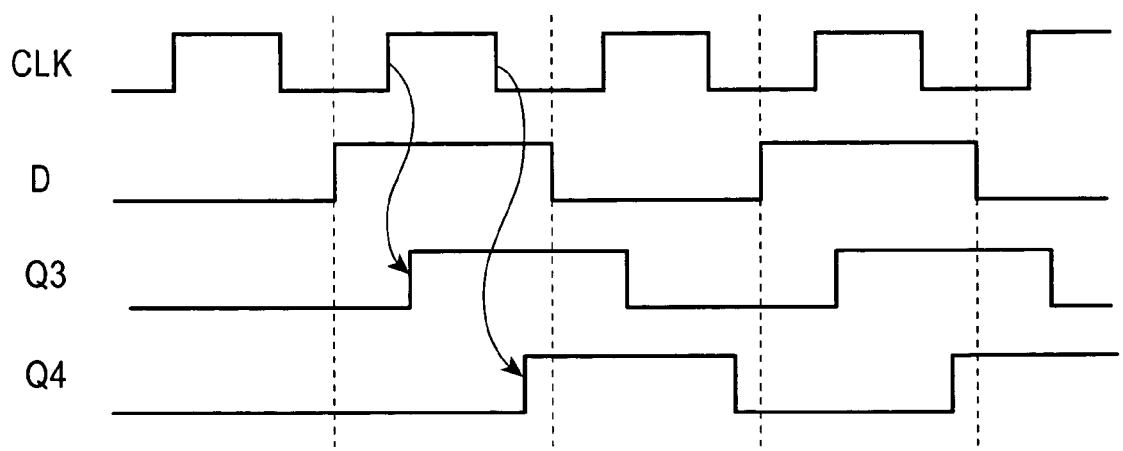
FIG. 6 is a wave form chart illustrating data transfer timing from one to the other of the scanning flip-flop circuits in the test circuit of FIG. 4.
Figure 7:
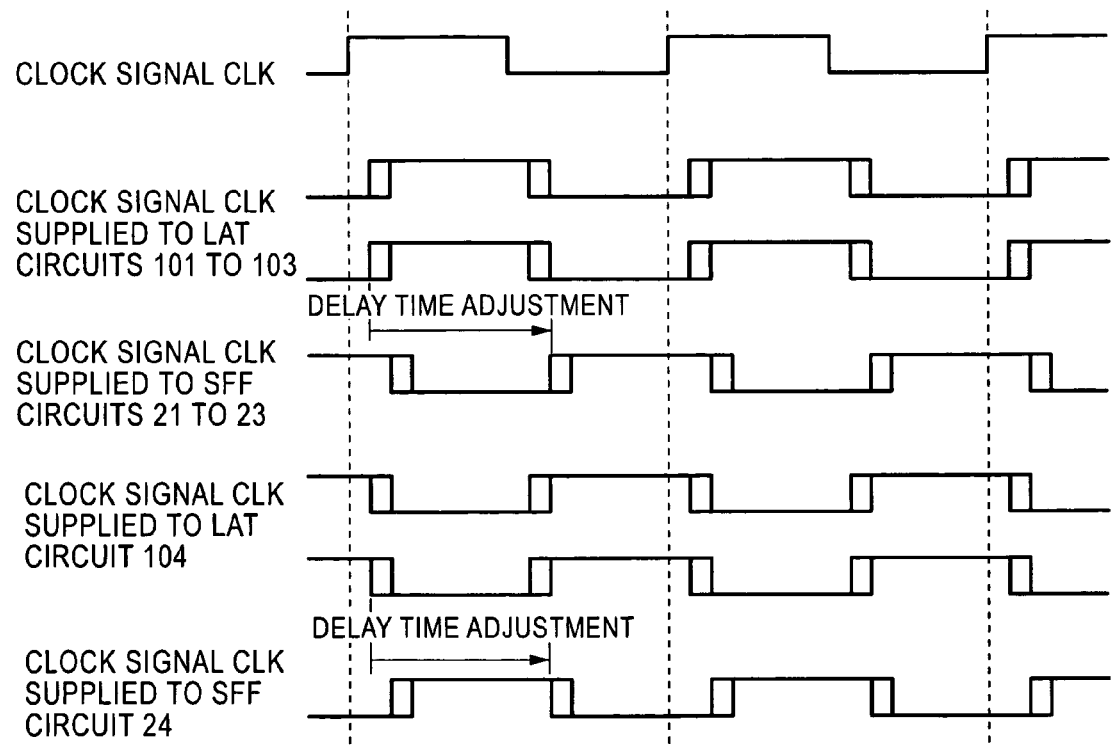
FIG. 7 is a wave form chart illustrating clock signals supplied to the latch circuits and the scanning flip-flop circuits of FIG. 4.

FIG. 5 is a flow chart showing a method for designing the third embodiment shown in FIG. 4. FIG. 6 is a timing diagram showing a date transfer from the SFF circuit 23 to the SFF circuit 24 of FIG. 4. FIG. 7 is a timing diagram showing clock signals supplied to the LAT circuits and SFF circuits of FIG. 4. A method for designing the test circuit of FIG. 4 will be described in reference to FIGS. 4 to 7.

In a step S1, while using information of a circuit diagram (net list) with four typical FF circuits for timing adjustment, the four typical FF circuits are replaced with SFF circuits 21 to 24.

In a step S2, a scanning path from the scanning input terminal 3 to the scanning output terminal 6 is set. That is, a sequence in which the scanning SFF circuits 21 to 24 holds an input data is determined, the scanning input terminal 3 and scanning output terminal 6 are provided, and the scanning paths 41 to 45, which connect the SFF circuits in the determined sequence, are provided.

In a step S3, LAT circuits 101 to 104 are respectively provided in front stages of SFF circuits 21 to 24 on the scanning path. The circuits 101 to 103, each of which operates at a trailing edge of the clock signal CLK, are connected to SFF circuits 21 to 23, each of which operates at a leading edge of the clock signal CLK. The latch 104, which operates at a leading-edge of the clock signal CLK, is connected to the SFF circuit 24 that operates at a trailing edge of the clock signal CLK.

In step S4, gate cell 12, which controls an output of the clock signal CLK in accordance with a mode designation signal MOD, is provided.

In a step S5, a clock-supplying path 13 for supplying the clock signal CLK at the same phase is provided and connected to the LAT circuits 101 to 103, each of which operates at the trailing edge of the clock signal, provided in the step S5. An inverter circuit 14 for inverting the clock signal CLK and a clock-supplying path 15 for supplying the inverted clock signal CLK are provided and connected to the LAT circuit 104 which operates at the leading-edge of the inverted clock signal CLK.

Reasons for providing two types of the LAT and SFF circuits, one of which operate at a leading edge of the clock signal CLK and the other of which operate at a trailing edge of the clock signal CLK, are as follows:

As shown in FIG. 4, the output terminal Q of the SFF circuit 23 which operate at a leading edge of a clock signal CLK is connected to the scanning input terminal SI of the SFF circuit 24 which operate at a trailing edge of the clock signal CLK via the scanning path 44. As shown in FIG. 6, a signal D is supplied to the SFF circuit 23 when the clock signal CLK is "L" level. A signal Q3 is output from the output terminal Q of the SFF circuit 23 at a leading edge of the clock signal CLK. On the other hands, a signal Q4 is output from the output terminal Q of the SFF circuit 24 at a trailing edge of the clock signal CLK. Data held by the SFF circuits 23 and 24 change during one cycle of the clock signal CLK, so that it is difficult to judge a failure in the scanning path 44 in the scan mode. When a connecting sequence of the SFF circuits 23 and 24 is reversed, it is possible to judge the failure because of two cycle of the clock signal. It is, however, difficult to adjust the clock signal.

In a step S6, a timing difference between the clock signal supplied to each SFF circuits 21 to 24 and the clock signal supplied to each LAT circuits 101 to 104 are calculated. A inverter circuit 11 for adjusting delay time is provided between the clock terminal 7 and the clock-supplying path 8.

The input terminal of the SFF circuit which operates at the leading-edge of the clock signal, is connected to the output terminal of the latch which operates at the trailing edge of a clock signal. As shown in FIG. 5, a delay time of the inverter circuit 11 is adjusted so that a clock signal supplied to the SFF circuit, which operates at the leading edge of the clock signal, rises after a clock signal supplied to the LAT drops. The input terminal of the SFF circuit that operates at the trailing edge of a clock signal, is connected to the output terminal of the latch which operates at a leading edge of the clock signal. A delay time of the inverter circuit 11 is adjusted so that a clock signal supplied to the SFF circuit, which operates at the leading edge of the clock signal, rises after a clock signal supplied to the LAT drops.

In step S7, timing of the clock signal supplied to each of the LAT circuits and SFF circuits is examined by a simulation. And, the design of the test circuit ends if it is determined that a prescribed function is filled with.

A test operation of the test circuit in FIG. 4 will be explained. Test operation is performed through the following processes A to D. Operation properties of the logic blocks 11 and 12 are examined by comparing the logic signals generated from the logic blocks 11 and 12 with expected data.

A. The Scanning Mode is Designated.

The mode designation signal MOD is supplied to the SFF circuits 21 to 24, and thus the scanning terminals SI of the SFF circuits 21 to 24 are selected. As a result, a scanning chain path from the scanning input terminal 3 to the scanning output terminal 6 is formed via the scanning path 41, the LAT circuit 101, the SFF circuit 21, the scanning path 42, LAT 102, the SFF circuit 22, the LAT circuit 103, the SFF circuit 23, the LAT circuit 104, and SFF circuit 24.

B. Scanning Input Data are Supplied.

Keeping the scanning mode in which the scanning chain path is formed, scanning input data SIN are supplied to the scanning input terminal 3 in synchronization with the clock signal CLK supplied to the clock terminal 7. When the clock signal CLK is "L" level, the scanning input data SIN from the scanning input terminal 3 is received by the LAT 101. When the clock signal CLK is changed from "L" level to "H" level, the data of the LAT 101 is held in the LAT 101 and then output. For instance, scanning input data SIN1, SIN2, SIN3, and SIN4 are sequentially supplied to scanning input terminal 3 in synchronization with the clock signal, and then the scanning input data SIN 1, SIN 2, SIN 3, and SIN 4 are held by SFF circuits 24, 23, 22, and 21, respectively. The scanning input data SIN 1 to 4 held by the SFF circuits 21 to 24 are supplied to input terminals IN1 and IN2 of logic blocks 11 and 12. The logic blocks 11 and 12 perform logic operations in response to the scanning input data SIN 1 to 4 and output resultant logic data LOG1, LOG2, LOG3, and LOG4 to the output terminals thereof OUT1 and OUT2. It should be noted that the SFF circuits 21 to 24 do not receive the resultant logic signals because the input terminals D of the SFF circuits 21 to 24 are not opened in the scanning mode.

C. The Normal Operation Mode is Designated.

The operation mode of the circuit is switched from the scanning mode to the normal operation mode by the mode designation signal MOD and one pulse of the clock signal is given to the scanning SFF circuits 21 to 24. By the mode designation signal MOD, the input terminal D of each the scanning SFF circuits 21-24 is selected. The scanning SFF circuits 21 and 22 receive the resultant logic signals from the logic block 12 and hold the resultant logic signals. The scanning SFF circuits 23 and 24 receive the resultant logic signals from the logic block 11 and hold the resultant logic signals.

D. The Scanning Mode is Designated.

The operation mode of the circuit is switched back to the scanning mode by the mode designation signal MOD and a clock signal is given to the scanning SFF circuits 21 to 24 from the clock terminal 7. As a result, the resultant logic signals LOG1 to 4 held by the scanning SFF circuits 21 to 24 are output to the scanning output terminal 6 in sequence.

By comparing scanning output data SOUT which are resultant logic signals (LOG1, LOG2, LOG3, LOG4) generated from the scanning output terminal 6 and expectation signals (E1, E2, E3, E4) calculated according to the scanning input data SIN, it is possible to examine performance of the logic blocks 11 and 12.

As mentioned above, the test circuit of the third embodiment is provided with LAT circuits 101 to 104, each of which holds a data at an edge of the clock signal opposite to that of SFF circuits 21 to 24, so that there is an advantage that a shift operation of the data is possible without a special consideration on a delay time of the data passing through the scanning chain path.

The gate cell 12, in addition, is provided in the circuit to stop the clock signal CLK supplied to the LAT circuits 101 to 104 at the normal operation mode, so that the third embodiment of the present invention can decrease electrical power consumption in comparison with the first embodiment having the inverter circuits 51 to 54 shown in FIG. 2.

It is required that a number of the LAT circuits is same as that of the SFF circuits. A number of each LAT circuits 101 to 104 is same, so that size of the circuit can be reduced compared with the case that the number of delayed-elements is increased or decreased according to required delay time.

In addition, the data holding timing at the scanning mode can be determined only by adjusting the timing of clock signal CLK supplied to the SFF circuits, so that it is possible to shorten design time of the test circuit and decrease the size of the test circuit. When a microprocessor at 200k gate level is designed by using the design method according to the present invention, the circuit area, gate number, and electric power consumption can be reduced by about 3%, about 7%, and about 8%, respectively, in comparison with the conventional test circuit circuit. In addition, the design time could be shortened about three days. The present invention is not limited to the first to third embodiments and may be modified as follows:

(1) The number of the logic blocks and the input-output terminals of the logic blocks is not limited to that of the embodiments. The number of the scanning chain path from the scanning data input terminal to the scanning data output terminal may be one and more. Plural of scanning chain paths may be formed in parallel.

(2) A test circuit according to the present invention is not limited to the embodiments that operate in response to single clock signal and may operate in response to plural clock signal.

This application is based on Japanese Patent Application No. 2005-368387 which is hereby incorporated by reference.

What is claimed is:

1. A test circuit for testing a basic logic block having at least two input terminals and at least two output terminals and at least one additional logic block having at least two input terminals and at least two output terminals, said basic logic block for receiving test data through said at least two input terminals thereof and outputting resultant data respectively through said at least two output terminal thereof in synchronism with a clock signal, and said at least one additional logic block for receiving test data through said at least two input terminals thereof and outputting resultant data through said at least two input terminals thereof in synchronism with said clock signal, said test circuit comprising:

at least two basic bit holding and relaying units whose output terminals are connected to said at least two input terminals of said basic logic block, respectively; and at least two additional bit holding and relaying units whose output terminals are connected to said at least two input terminals of said additional logic block, respectively, wherein both of said basic and additional bit holding and relaying units operate in synchronism with said clock signal, each of said basic and additional bit holding and relaying units has a data input terminal, a scanning input terminal and a mode switching terminal, receives a data bit by bit selected from said test data or resultant data respectively supplied to said data input terminal and said scanning input terminal in accordance with a mode designation signal supplied to said mode switching terminal thereby to hold said data and then relay said data to said output terminal thereof, one of said basic bit holding and relaying units receives at said scanning input terminal thereof basic output data generated from the other of said basic bit holding and relaying units while an output data from said one of the basic bit holding and relaying units is supplied to said scanning input terminal of one of said additional bit holding and relaying units, an additional output data from said one of the additional bit holding and relaying units is supplied to said scanning input terminal of the other of said additional bit holding and relaying units, an external input data is supplied to said scanning input terminal of said other of the basic bit holding and relaying units, an output terminal of said other of the additional bit holding and relaying units is a test data output terminal, and said basic and additional bit holding and relaying units are respectively provided with signal delay circuits at a front stage thereof, said signal delay circuits respectively delaying said basic and additional input data.

2. A test circuit according to claim 1, wherein said basic logic blocks, said additional logic blocks, said basic bit holding and relaying units and said additional holding and relaying units are integrally formed in an IC chip.

3. A test circuit according to claim 2, wherein said signal delay circuits are either latch circuits for respectively latching said basic and additional output data or inverter circuits for respectively adjusting a timing of said basic and additional output data.

4. A test circuit according to claim 1, wherein said signal delay circuits are either latch circuits for respectively latching said basic and additional output data or inverter circuits for respectively inverting said basic and additional output data.

5. A test circuit according to claim 4, wherein each of said latch circuits latches said basic and additional output data in response to said clock signal which is supplied from gate cell in response to said mode designation signal.

* * * * *